(12) United States Patent
Kataoka et al.

(10) Patent No.: US 6,319,620 B1
(45) Date of Patent: *Nov. 20, 2001

(54) MAKING AND USING AN ULTRA-THIN COPPER FOIL

(75) Inventors: Takashi Kataoka, Ageo; Yutaka Hirasawa, Okegawa; Takuya Yamamoto; Kenichiro Iwakiri, both of Ageo, all of (JP)

(73) Assignee: Mitsui Mining & Smelting Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/039,960

(22) Filed: Mar. 16, 1998

(30) Foreign Application Priority Data

Jan. 19, 1998 (JP) .................................................. 10-020150

(51) Int. Cl.$^7$ ...................................................... B32B 15/08
(52) U.S. Cl. ...................... 428/626; 428/624; 428/607; 428/612; 428/355 R; 428/41.8; 428/901; 428/336; 428/220; 205/76; 174/259; 174/255
(58) Field of Search ........................... 428/901, 336, 428/458, 704, 914, 195, 220, 624, 626, 607, 612, 355 R, 40.9, 40.1, 41.8; 174/255, 256, 259; 205/76

(56) References Cited

U.S. PATENT DOCUMENTS

| | | | |
|---|---|---|---|
| 3,281,339 | * | 10/1966 | Edgar et al. . |
| 3,616,186 | * | 10/1971 | Blackwell . |
| 3,936,548 | | 2/1976 | Konicek ................................ 427/405 |
| 3,984,598 | | 10/1976 | Sarazin et al. . |
| 3,998,601 | | 12/1976 | Yates et al. ............................. 29/195 |
| 4,293,617 | | 10/1981 | Nagy ...................................... 428/469 |
| 4,357,395 | | 11/1982 | Lifshin et al. ....................... 428/607 |
| 4,394,419 | * | 7/1983 | Konicek . |
| 5,863,410 | * | 1/1999 | Yates et al. . |

FOREIGN PATENT DOCUMENTS

| 1458260 | 12/1976 | (GB) ............................... C25D/1/04 |
|---|---|---|

* cited by examiner

Primary Examiner—Blaine Copenheaver
Assistant Examiner—Wendy Boss
(74) Attorney, Agent, or Firm—Jenkens & Gilchrist

(57) ABSTRACT

This invention provides a composite foil comprising an organic release layer between a metal carrier layer and an ultra-thin copper foil, and a process for producing such composite foils comprising the steps of depositing the organic release layer on the metal carrier layer and then forming an ultra-thin copper foil layer on said organic release layer, preferably by electrodeposition. The organic release layer preferably is a heterocyclic compound selected from triazoles, thiazoles, imidazoles, or their derivatives, and provides a uniform bond strength which is adequate to prevent separation of the carrier and ultra-thin copper foil during handling and lamination, but which is significantly lower than the peel strength of a copper/substrate bond, so that the carrier can easily be removed after lamination of the composite foil to an insulating substrate. The invention also includes laminates made from such composite foils and printed wiring boards made from such laminates.

18 Claims, No Drawings

MAKING AND USING AN ULTRA-THIN COPPER FOIL

FIELD OF THE INVENTION

The present invention relates generally to making and using ultra-thin copper foil and, more particularly, to a composite foil which facilitates handling of ultra-thin copper foil in the production of printed wiring boards. The invention also relates to a composite foil in which an organic release layer with uniform bonding strength is disposed between a metallic carrier and an ultra-thin copper foil, and the processes of producing and using such a composite foil.

BACKGROUND OF THE INVENTION

With the recent miniaturization and densification of electronic equipment, the pattern widths and spacing of printed wiring boards have become smaller. As a result, the copper foil used has tended to become thinner, for example, 12 μm thick foils, rather than conventional 35 μm and 18 μm foils. Recently, the need for thin copper foil has increased and ultra-thin copper foils have been tried. Handling a copper foil of 12 μm or less, however, is difficult. For example, it can wrinkle or tear while being produced and/or handled. Similar problems occur when an ultra-thin copper foil is used as the outer layer of a multi-layer printed wiring board. A method of preventing these problems with handling ultra-thin copper foil is needed.

It has been previously proposed to support ultra-thin copper foils on a metal carrier layer to allow the copper foil to be separated from the carrier layer. Several carrier metals and types of release layers have been suggested. Producing printed wiring boards from such supported ultra-thin copper foils could be done by electrolytic deposition of a copper layer having a thickness of 1–12 μm onto a metal carrier layer having a thickness of 18–70 μm, then applying the surface of the copper layer to a prepreg, such as a glass-reinforced epoxy resin or the like, and laminating by hot pressing. Finally, the metal carrier layer would be separated, leaving a copper-clad laminate from which a printed wiring board can be made.

When a copper sheet is used as a carrier, a chromium layer may be used as a release layer between the copper foil and the copper carrier layer, as has been disclosed in, for example, Japanese Patent Application Publication (Examined) No. Sho 53-18329.

Alternatively, when aluminum is used as the carrier layer, several types of release layers have been proposed, for example:

1. a release layer of the sulfides or oxides of Cr, Pb, Ni and Ag (for example, in U.S. Pat. No. 3,998,601);
2. a release layer formed of nickel or nickel alloy plating after zinc immersion (for example, in U.S. Pat. No. 3,936,548);
3. a release layer of aluminum oxide (for example, in Japanese Patent Application Publication (Examined) No. Sho 60-31915 and U.K. Patent No. GB 1,458,260); or
4. a release layer of silica (for example, in U.S. Pat. No. 4,357,395).

Such conventional supported copper foils have, however, been found to present problems.

Since the release layer is not uniform over the surface of the carrier layer, bond strength between the carrier layer and the ultra-thin copper foil is uneven. Consequently, when the carrier layer is peeled off after laminating a composite foil, some of the ultra-thin copper foil may remain on the carrier layer or some of the carrier layer may remain on the ultra-thin copper foil. In either case, the required circuit pattern cannot be made. Further, weak bond strength may cause an ultra-thin copper foil to partially or entirely separate from the carrier layer during production and use of the composite foil.

When oxides, sulfides, chromium or inorganic materials, such as chromium or the like, are used as release layers, some of the inorganic material remains on the surface of the ultra-thin copper foil after the carrier layer is peeled off. This inorganic material must be removed before the circuit patterns are made, making it necessary to add extra processing steps.

Finally, when the composite foil is laminated to a substrate, such as an epoxy prepreg at high temperatures, it becomes difficult to peel off the carrier layer.

Because of these problems, composites of ultra-thin copper foil on a support layer are not generally used in industry at present, despite the proposed methods just discussed.

Accordingly, an object of the present invention is to provide a composite foil which overcomes the problems discussed above and a process for making such composite foils. Another object of the present invention is to provide a copper-clad laminate which is made by using such a composite foil, and a printed wiring board employing such a copper-clad laminate.

The inventors have investigated the metals and/or metal compounds which have conventionally been suggested as release layers for composite foils in the prior art. They have found that when peeling off a support layer from an ultra-thin copper foil after the copper foil has been laminated to a resin substrate by hot pressing, the peel strength is variable and the bond can be too strong. Also, when a release layer is not uniformly formed, or when heat is used during laminating, the metal used in the release layer may be diffused into both the support layer and the ultra-thin copper foil.

The inventors have also investigated organic compounds which have not been considered as release layers. As a result, the inventors have found that the above-mentioned problems of composite foils can be solved by using certain organic compounds as release layers, as will be seen in the discussion below.

SUMMARY OF THE INVENTION

As used in this invention, the term "bond strength" refers to the force required to separate the carrier layer from the ultra-thin copper foil. The term "peel strength" refers to the force required to separate the ultra-thin copper foil from a substrate to which it has been laminated.

The present invention comprises a composite foil with a new release layer having the following features.

1. The release layer is easy to apply.
2. The bond strength between the ultra-thin copper foil and the carrier layer is uniform, and has a relatively low value compared to the peel strength of the copper foil after lamination to a substrate.
3. Mechanical polishing and pickling to remove an inorganic material which remains on the surface of an ultra-thin copper foil is not necessary since no inorganic material is used. Thus, the formation of wiring patterns is simplified by reducing the number of processing steps.
4. Although bond strength is low, it is sufficient to prevent separation of the ultra-thin copper foil from the carrier layer during handling.

5. The composite foil has sufficient peel strength after lamination to a substrate and does not separate during processing into a printed circuit board.

6. The carrier layer can be separated from the ultra-thin copper foil even after laminating at elevated temperatures.

7. It is easy to recycle the carrier layer after it has been separated from since the residual release layer is easy to remove.

Organic compounds which have been found useful in making composite foils have the following characteristics.

1. They are organic compounds which contain nitrogen, preferably heterocyclic compounds.
2. They form a bond with copper.
3. They retain the ability to bond with copper even after exposure to the temperatures used in laminating copper foil to an insulating substrate, preferably at a temperature of 120° C. or higher.
4. They form a bond between the ultra-thin copper foil and the carrier layer which is relatively low compared to the peel strength between the ultra-thin copper foil and the insulating substrate. The bond strength between two layers of copper is sufficient to prevent their separation during handling and lamination, but low enough to permit the carrier layer to easily be removed after the composite foil has been laminated.
5. They provide a very thin release layer which permits uniform electrodeposition of the copper foil.

Preferred organic compounds are heterocyclic compounds containing nitrogen, in particular, members of the group consisting of triazoles, thiazoles, and imidazoles, or their derivatives. Similar materials have been used for corrosion protection of copper, but they have not been suggested as being suitable for release layers.

In one aspect, the invention is a composite foil having an organic release layer having the characteristics just described, which is disposed between a metal carrier layer, which may also be a foil, and an ultra-thin copper foil.

The invention also includes a process for producing a composite foil by the steps of forming an organic release layer on a metal carrier layer and thereafter forming an ultra-thin copper foil on the organic release layer, preferably by electrodeposition.

A copper-clad laminate of the present invention comprises the composite foil according to the invention laminated to an insulating substrate. Alternatively, it comprises the ultra-thin copper foil laminated to the insulating substrate which remains after peeling off the metal carrier layer.

A printed wiring board of the present invention results from forming a wiring pattern from the ultra-thin copper foil exposed by separating the metal carrier layer from the copper-clad laminate just described.

DESCRIPTION OF ILLUSTRATIVE EMBODIMENTS

In general, the composite foil of the present invention is characterized by having an organic release layer between a metal carrier layer and an ultra-thin copper foil. The organic release layer satisfies the five characteristics discussed above. The release layer is an organic compound containing nitrogen and, preferably, is a heterocyclic compound selected from the group consisting of triazoles, thiazoles, and imidazoles, or their derivatives.

As the metallic carrier layer, copper or a copper alloy is preferably used since the release layer bonds to copper. An organic compound according to the present invention may be applied to a support material other than copper or a copper alloy, for example, copper-plated aluminum. Other metals could be used, provided the release layer forms a uniform bond with that metal as well as with the ultra thin copper foil. The thickness of the supporting metallic layer is not considered to be critical, and it may be a foil from about 18–70 $\mu$m thick. Since a typical carrier layer is relatively thin, it will also be referred to as a foil, but it is to be understood that the support layer could be thicker than ordinary foils. For example, heavier carrier sheets up to about 5 mm thick may be used.

The thickness of the ultra-thin copper foil layer to be formed on the organic release layer is generally not more than 12 $\mu$m thick and may be much thinner, for example, 5–7 $\mu$m or less. The reason for this is that a copper foil having a thickness of more than 12 $\mu$m can be produced by conventional processes, and can be handled without a carrier layer. The ultra-thin copper foil layer is preferably formed by electrodeposition, although vapor deposition or electroless plating may be employed, provided that the ultra-thin copper layer is suitable for making circuit patterns and has acceptable bond and peel strengths.

In a preferred embodiment, the organic release layer comprises at least one member selected from the group consisting of triazoles, thiazoles, and imidazoles, or their derivatives, which are selected for their ability to bond to copper and to retain the ability to bond to copper at lamination temperatures. The triazole group includes orthotriazole (1,2,3-triazole) and isomers thereof, or derivatives thereof. Orthotriazole derivatives include benzotriazole, tolyltriazole, carboxybenzotriazole, chlorine substituted benzotriazole, aminotriazole and isomers thereof, or derivatives such as alkali metal salts or amine salts and the like. As the isomers of the aminotriazole, 3-amino-1,2,4-triazole, 2-amino-1,3,4-triazole, 4-amino-1,2,4-triazole and 1-amino-1,3,4-triazole can be used. Examples of derivatives of aminotriazole include sodium salts or amine salts including, for example, monoethanolamine salts, cyclohexylamine salts, diisopropylamine salts, morpholine salts and the like.

Examples of thiazoles and derivatives thereof include thiazole, 2-mercaptobenzothiazole, dibenzothiazyldisulfide, cyclohexylamine salts of 2-mercaptobenzothiazole, dicyclohexylamine salts of 2-mercaptobenzothiazole and the like.

Examples of imidazoles and derivatives thereof include imidazole, 2-methylimidazole, 2-ethyl-4-methylimidazole, 2-phenylimidazole, 1-benzyl-2-methylimidazole and the like. The organic release layer according to the present invention may be formed not only of the above-mentioned organic compounds, but also of related organic metal compounds such as the zinc salt of 2-mercaptobenzothiazole. Since the quantity of metal atoms is small in such compounds, they can be distinguished from the metals and inorganic compounds previously used in the art.

Where adhesion is measured in accordance with the Japanese standard JIS-C-6481, the range of the bond strength between the ultra-thin copper foil and the carrier of the composite foils of the invention is about 0.005–0.3 kgf/cm, preferably 0.005–0.1 kgf/cm, to assure that the carrier layer can be separated from the ultra-thin copper foil after laminating the composite foil on an insulating substrate. When less than 0.0005 kgf/cm, the bond strength is so weak that bulging or separating of the ultra-thin copper foil occurs during lamination with a substrate or during punching or drilling of a laminate or a circuit board. When greater than 0.3 kgf/cm, the bond strength is so large that it is necessary to provide a special treatment when separating the metal 5 carrier layer as, for example, the use of an aqueous medium in U.S. Pat. No. 3,886,022.

A composite foil of the invention has little or no variability in the bond strength between the metal carrier layer and the ultra-thin copper foil. The bond strength is consistent both across individual composite foils and among multiple examples of the composite foil.

Since only a thin organic film is attached to the surface of an ultra-thin copper foil after separating the supporting metallic layer, removal of the organic film is possible by cleaning with a dilute acid solution. A harsh pickling step is not necessary. In addition to this, the organic layer remaining on the surface of the ultra-thin copper foil after the carrier has been removed can serve as a passivator to prevent oxidation. Furthermore, since it is easy to recycle a supporting metallic layer after it has been separated, the production and environmental problems discussed above are avoided.

In producing a composite foil of the invention, an organic release layer is formed on a metal carrier layer, and thereafter an ultra-thin copper layer is deposited on the organic release layer. Prior to the formation of the organic release layer, it is preferable to remove any copper oxide on the surface of the metal carrier layer to assure that a uniform bond strength is achieved. This may be done, for example, by rinsing the carrier in a dilute acid solution, e.g., dilute sulfuric acid. The organic release layer may be applied to the metal carrier layer by dipping or coating, or any method by which a uniform layer is formed on a carrier. For example, by dipping a metal carrier layer into an aqueous solution of the selected organic compound, e.g., a triazole derivative, to form an organic release layer. Concentration of the organic compound in the aqueous solution is preferably about 0.5–10% by weight, and dipping time is preferably about 5–60 seconds. Although higher concentrations and longer dipping times are possible, they are not preferred since they would increase costs and decrease productivity. After removing the carrier from the solution, the excess is removed by rinsing with water so that only a very thin layer bonded to the carrier surface remains. The thickness of the film after rinsing is difficult to measure accurately, but it is believed to be about 30–60 Å. The range of acceptable film thicknesses is not known, but if the film is too thin, the ultra-thin copper layer will adhere to the carrier, while if the film is too thick, uniform electrodeposition of copper is not feasible.

The ultra-thin copper foil preferably is electrodeposited on top of the organic release layer which has been placed on the metal carrier. There are several methods of electrodepositing copper, such as using a copper pyrophosphate plating bath or an acidic copper sulfate plating bath, among others. While any type of plating bath may be used to form the ultra-thin copper foil, some types are preferred. To avoid undesirable pin holes and/or porosity, initial plating is preferably done in a copper cyanide bath or a copper pyrophosphate bath, which give more uniform electrodeposition of copper. Copper pyrophosphate plating is preferred since it has is advantages with respect to the environment and safety of operations. On the other hand, copper sulfate plating baths are advantageous if one considers productivity and cost. The acidic bath may, however, remove the thin release layer and, thus, the initial plating in an acidic bath should be avoided for achieving best results. Thus, it is preferred that a first copper plating step providing a thickness of at least 0.5 $\mu$m, preferably 0.5–1.0 $\mu$m, is done in a copper pyrophosphate bath, followed by a second plating step using a copper sulfate plating bath to provide the desired thickness of the ultra-thin copper foil. This method is used in the Examples below.

The conditions for copper pyrophosphate plating are not believed to be critical.

It is preferred, however, that the copper concentration in the copper pyrophosphate plating bath be about 10–50 g/L and the potassium pyrophosphate about 100–700 g/L. The pH of the electrolytic solution preferably should be about 7–12. The bath temperature should be about 30–60° C., and the current density about 1–10 A/dm$^2$.

The conditions for acidic copper sulfate plating are also not considered critical. It is preferred, however, that the copper concentration in the copper sulfate plating bath be about 30–100 g/L, and that the sulfuric acid be about 50–200 g/L. The bath temperature of electrolytic solution preferably is about 30–80° C. and the current density about 10–100 A/dm$^2$.

In order to enhance adhesion of the ultra-thin copper foil to an insulating substrate, a bond enhancing treatment may be placed on the ultra-thin copper foil layer by conventional methods, such as forming a nodular copper deposit on the surface of the foil by adjusting plating conditions. An example of a nodularization process may be found in U.S. Pat. No. 3,674,656. After the bond enhancing treatment is complete, a conventional passivation treatment may be added to the surface of the ultra-thin copper foil, such as by depositing zinc, zinc chromate, nickel, tin, cobalt and chromium on the nodularized ultra-thin copper layer. An example of such methods may be found in U.S. Pat. No. 3,625,844.

The surface of the treated ultra-thin copper foil produced by the methods just described is laminated to an insulating substrate using heat and pressure to obtain a copper-clad laminate. As the insulating substrate, any of the resin substrates which are used to make circuit boards for electronic equipment can be used. Such resin substrates may include FR-4 (glass-fiber-epoxy), paper-phenolic, paper-epoxy, polyimides and the like. The metal carrier layer is then separated, leaving a copper-clad laminate consisting of the ultra-thin copper foil and insulating substrate. A printed wiring board is made by forming wiring patterns from the exposed ultra-thin copper layer.

The present invention will be described in further detail with reference to Examples below.

EXAMPLE 1

As a metal carrier layer, an electrolytically deposited copper foil having a thickness of 35 $\mu$m was made. Such foils typically have a rough or matte side and a smooth or shiny side. Then, an organic release layer was formed on the shiny side of the foil, followed by a first copper plating step, a second copper plating step, a bond enhancing treatment, and a passivation treatment, using the following procedures.

A. Formation Of The Organic Release Layer

The 35 $\mu$m copper foil was dipped into 2 g/L carboxybenzotriazole (CBTA) aqueous solution at 30° C. for 30 seconds, removed, and rinsed in deionized water to form an organic release layer of CBTA.

B. First Copper Plating Step

A cathodic electroplating treatment was carried out with a current density of 3 A/dm$^2$ by using a pyrophosphate plating bath, with a bath temperature of 50° C. and a pH of 8.5. The bath contained 17 g/L of copper and 500 g/L of potassium pyrophosphate. An ultra-thin copper foil having a thickness of 1 $\mu$m was deposited on the organic release layer.

C. Second Copper Plating Step

The surface of the 1 $\mu$m ultra-thin copper was rinsed in deionized water and then electroplated at a current density of 60 A/dm² using a copper sulfate plating bath having a bath temperature of 50° C., and containing 80 g/L copper and 150 g/L sulfuric acid, to deposit about 5 µm thickness of copper, thereby obtaining an ultra-thin copper foil having a total thickness of about 6 µm.

D. Bond Enhancing Treatment

The bond enhancing treatment was carried out on the surface of the ultra-thin copper foil layer by a conventional nodularizing surface treatment using a copper sulfate plating bath. The current density was increased to form nodules of copper on the surface of the ultra-thin copper layer.

E. Passivation Treatment

A passivation treatment was applied to the surface of the bond enhanced ultra-thin copper foil layer by depositing zinc chromate from solution by conventional electrodeposition methods to obtain a composite foil ready for lamination.

The composite foil was laminated on four sheets of 0.1 mm thick FR-4 prepregs, and then hot pressed under a pressure of 25 kg/cm² at 175° C. for 60 minutes to obtain a copper-clad laminate. The strength of the bond between the ultra-thin copper foil and the 35 µm copper carrier layer was measured in accordance with JIS-C-6481, and found to be 0.015 kgf/cm. The copper carrier layer could easily be separated from the copper-clad laminate, and the bond strength was found to be uniform across the sample.

EXAMPLE 2

A composite foil was made in the same manner as in Example 1, except that an organic release layer was formed by using an aqueous solution of 2 g/L N,N bis(benzotriazole-methyl) urea (BTD-U) instead of carboxybenzo-triazole (CBTA).

The composite foil was laminated on four sheets of 0.1 mm thick FR-4 prepregs, as in Example 1, using a pressure of 25 kg/cm, and a temperature of 140° C. for 60 minutes to obtain a copper-clad laminate. The strength of the bond between the ultra-thin copper foil and the 35 µm copper carrier was measured to be 0.025 kgf/cm. The copper carrier could easily be separated from the copper-clad laminate, and the bond strength was uniform across the sample. Then, the copper-clad laminate was post-cured at 175° C. for 60 minutes.

EXAMPLE 3

A composite foil was made in the same manner as in Example 1, except that the organic release layer was formed by using an aqueous solution of 2 g/L benzotriazole (BTA) instead of carboxybenzotriazole (CBTA).

The composite foil was laminated on four sheets of 0.1 mm thick FR-4 prepregs, as in Example 1, using a pressure of 25 kg/cm at 140° C. for 60 minutes to obtain a copper-clad laminate. The strength of the bond between the ultra-thin copper foil and the 35 µm copper carrier was measured to be 0.043 kgf/cm. The copper carrier could easily be separated from the laminate, and the bond strength was uniform across the sample. Thereafter, the laminate was heated at 175° C. for 60 minutes to postcure it.

EXAMPLE 4

A composite foil was made as in Example 1, except that an organic release layer was formed by using a mixed aqueous solution of 2 g/L carboxybenzotriazole (CBTA) and 0.5 g/L benzotriazole (BTA) instead of carboxybenzotriazole (CBTA).

The composite foil was laminated on two sheets of polyimide prepregs, each having a thickness of 0.1 mm, using a pressure 25 kg/cm² at 216° C. for 270 minutes to obtain a copper-clad laminate. The strength of the bond between the ultra-thin copper foil and the 35 µm copper carrier was measured to be 0.009 kgf/cm. The copper carrier could easily be peeled off from the laminate, and the bond strength was uniform across the sample.

EXAMPLE 5

Composite foils produced by the method of Example 1 were laminated on both surfaces of an inner layer material on which wiring patterns previously had been formed, using a 0.18 mm thick FR-4 prepreg as an intermediate layer and by pressing at 175° C. and 25 kg/cm² for 60 minutes. After cooling down, the bond between the ultra-thin copper foil and the metallic carrier was measured to be 0.015 kgf/cm. The supporting metallic layer could easily be separated from the laminate, and the bond strength was uniform.

EXAMPLE 6

Using a copper-clad laminate produced by the methods of Example 1, a drill having a diameter of 0.3 mm was used to make holes in the laminate. A conventional desmear treatment with potassium permanganate solution was done to remove epoxy resin. Then, the panel was plated to a thickness of 15 µm. A circuit pattern was formed (line width/line space=50 µm/50 µm) to obtain a printed wiring board. The wiring pattern was found to be free of shorts or open spaces. Two of these printed wiring boards were laminated together using a 0.18 mm thick FR-4 prepreg by hot pressing to obtain a multi-layer printed wiring board having four conductive layers. There were no problems. The ultra-thin copper foil was not torn and no wrinkles were formed. Thus, an improved multi-layer printed wiring board was obtained in both Examples 5 and 6, which had very fine 50 µm circuit lines and spaces.

EXAMPLE 7

The ultra-thin copper foil in each of the copper-clad laminates made in Examples 1–5 was copper-plated by electroplating to a total thickness of 18 µm. Next, the peel strength (measured by JIS-C-6481) between the 18 µm thick copper layer and substrate was measured. The ultra-thin copper cannot be tested by this method as it is too thin and weak, thus, the additional copper plating is applied to permit the test to be done.

A circuit pattern was formed by conventional etching methods using acid copper chloride and dry film resist on the five copper-clad laminates from Examples 1–5. The line width/line spacing again was 50 µm/50 µm. The results obtained are shown in Table 1.

TABLE 1

|  | Peel Strength (kgf/cm) | Etching Properties |
| --- | --- | --- |
| Example 1 | 1.3 | Good |
| Example 2 | 1.2 | Good |
| Example 3 | 1.3 | Good |
| Example 4 | 1.0 | Good |
| Example 5 | 1.3 | Good |

The above results show suitable performance of the copper-clad laminates for electronic equipment. It can be concluded that the peel strength of the ultra-thin copper foil is comparable to conventional thick copper foils, and much greater than the bond strength measured between the ultra-thin copper and the carrier layer. Furthermore, these laminates were found to yield very superior circuit patterns in that they had no opens or shorts at a line width and spacing of 50 μm.

As demonstrated above, the invention provides an organic release layer is between a metallic carrier and an ultra-thin copper foil. The bond strength is uniform and low enough so that the ultra-thin copper foil is not damaged when the metal carrier layer is stripped off. Thus, an ultra-thin copper foil having improved handling properties has been produced. The organic release layer can be very easily formed by dipping or coating an aqueous solution containing triazoles, thiazoles, imidazoles, or their derivatives.

The release layer is not inorganic, and only a thin organic layer remains on the ultra-thin copper foil after separating the metal carrier layer. Thus, only cleaning with dilute acid to remove the organic residue is needed. Furthermore, since no metal is used in the release layer, the supporting metallic layer can be recycled and waste solution disposal is easy, without causing environmental problems.

What is claimed is:

1. A composite foil comprising a release layer uniformly disposed between a metal carrier layer and an ultra-thin copper foil wherein the release layer is an organic compound characterized by:
   a. containing at least one nitrogen atom;
   b. being capable of forming a bond with said copper foil and said metal carrier layer;
   c. retaining the ability to bond with copper after exposure to temperatures used in laminating said composite foil to a substrate;
   d. having a bond strength between said ultra-thin copper foil and said metal carrier layer of about 0.005 to 0.3 kgf/cm which is uniform and lower than the peel strength of said copper foil when laminated to a substrate, thereby permitting the metal carrier to be separated from said copper foil when said copper foil has been laminated to a substrate, and
   e. providing a very thin release layer which permits uniform deposition of said ultra-thin copper foil.

2. A composite foil of claim 1, wherein said release layer comprises a heterocyclic compound and at least one member of the group consisting of triazoles, thiazoles, imidazoles, and derivatives thereof.

3. A composite foil of claim 1, wherein said release layer is a triazole or derivatives thereof.

4. A composite foil of claim 3, wherein said triazole is CBTA, CTD-U, BTA, or mixtures thereof.

5. A composite foil of claim 1, wherein said organic compound retains its ability to bond with copper after exposure to temperatures above 120° C.

6. A composite foil of claim 1, wherein said metal carrier layer is copper or copper alloy.

7. A composite foil of claim 1, wherein said metal carrier layer is copper-coated aluminum.

8. A composite foil of claim 1, wherein the thickness of said ultra-thin copper foil is less than 12 μm.

9. A composite foil of claim 1, wherein said metal carrier layer has a thickness up to about 5 mm.

10. A composite foil of claim 9, wherein said metal carrier layer has a thickness of about 18–70 μm.

11. A composite foil of claim 1, wherein said ultra-thin copper foil further comprises a nodularization treatment on the exposed copper surface thereof to enhance the peel strength between the ultra-thin copper foil and a substrate.

12. A composite foil of claim 11, wherein said ultra-thin copper foil further comprises a passivated treatment on the exposed surface thereof to prevent oxidation of the surface of the ultra-thin copper foil.

13. A copper-clad laminate comprising a composite foil of claim 1, laminated to a substrate.

14. A copper-clad laminate formed by laminating the composite foil of claim 1 to a substrate and exposing the ultra-thin copper foil by removing the metal carrier layer.

15. A printed wiring board comprising the copper-clad laminate of claim 14.

16. A multi-layer printing wiring board formed by laminating on at least one side of an inner layer board on which wiring patterns were previously formed a composite foil according to claim 1 to obtain a copper clad laminate, separating the metal carrier layer from the copper clad laminate to expose the ultra-thin copper foil, and forming a wiring pattern on said ultra-thin copper foil, thereby obtaining a multi-layer printed wiring boards.

17. A multi-layer printed wiring board formed by laminating a plurality of printed wiring boards according to claim 15.

18. A multi-layer printed wiring board formed by laminating a plurality of printed wiring boards according to claim 16.

* * * * *